United States Patent [19]

Banks et al.

[11] Patent Number: 5,073,233
[45] Date of Patent: * Dec. 17, 1991

[54] METHOD OF MAKING A METALLIC PATTERN ON A SUBSTRATE

[75] Inventors: Christopher P. Banks, Saffron Walden; Edward Irving, Higher Whitley, both of England

[73] Assignee: Ciba-Geigy Corporation, Ardsley, N.Y.

[*] Notice: The portion of the term of this patent subsequent to Aug. 29, 2006 has been disclaimed.

[21] Appl. No.: 532,533

[22] Filed: Jun. 4, 1990

[30] Foreign Application Priority Data

Jun. 7, 1989 [GB] United Kingdom ............... 8913090

[51] Int. Cl.$^5$ .................... C25D 5/48; C23F 1/02
[52] U.S. Cl. ........................... 156/656; 156/659.1; 156/666; 156/668; 156/904; 430/323; 430/325; 430/330; 29/846; 205/125; 205/224
[58] Field of Search ............ 156/656, 659.1, 904; 427/96, 388.1, 388.2; 430/325, 323, 330; 204/15, 56.1, 23; 29/846, 847, 852, 853

[56] References Cited

U.S. PATENT DOCUMENTS

| | | | |
|---|---|---|---|
| 3,542,739 | 11/1970 | Krimm et al. | 526/301 |
| 4,113,958 | 9/1978 | Tucker | 560/32 |
| 4,125,661 | 11/1978 | Messerschmidt, Jr. et al. | 156/656 X |
| 4,375,498 | 3/1983 | Le Minez et al. | 427/407.1 X |
| 4,604,344 | 8/1986 | Irving et al. | 430/327 X |
| 4,746,399 | 5/1988 | Demmer et al. | 156/656 |
| 4,751,172 | 6/1988 | Rodriguez et al. | 430/314 |
| 4,861,438 | 8/1989 | Banks et al. | 156/659.1 X |

OTHER PUBLICATIONS

Derwent Abst. No. 02694T-AL, Oct. 5, 1971.

*Primary Examiner*—David A. Simmons
*Assistant Examiner*—Thi Dang
*Attorney, Agent, or Firm*—Luther A. R. Hall

[57] ABSTRACT

Metallic patterns, such as printed circuits, are prepared by immersing metal substrates, bearing electrodeposited films and resist films in patterned areas, into an aqueous solution or dispersion of a hardening agent so that the hardening agent diffuses only into the electrodeposited film. This is followed by curing the hardening agent by heat or irradiation to render it resistant to the solvent used to remove the resist film and to the etchant solution for the metal exposed when the resist film is removed.

19 Claims, No Drawings

METHOD OF MAKING A METALLIC PATTERN ON A SUBSTRATE

The present invention relates to a method of making metallic patterns such as printed circuits and the like.

There are numerous methods used for the manufacture of printed circuit boards, although some of the steps used are common to the various methods.

In the cases of single sided printed circuit boards, the board, comprising a copper clad base laminate, has holes drilled where desired, a resist is coated on the copper in a predetermined pattern, using screen printing or photoimaging techniques, to give a board having bare copper in some areas and copper coated by the resist in remaining areas, the bare copper is then plated with a tin-lead alloy, the resist is then removed, the copper thereby exposed is etched using an etchant which does not remove the tin-lead alloy, and the alloy is finally removed using a tin-lead alloy stripper.

In the case of double sided, plated through hole printed circuit boards, the procedure is similar, but with the following additional steps:

after the holes are drilled the board is subjected to electroless copper deposition to deposit copper on the surface of the holes (as well as over all the copper); and after applying the resist in a predetermined pattern the board is subjected to copper electroplating to deposit copper on the bare copper parts including the surface of the holes.

These processes are disadvantageous due to the high cost of the tin-lead alloy stripper and the necessary subsequent cleaning; furthermore the tin-lead stripper (usually a mixture of hydrogen peroxide and sulphuric acid) is aggresive to the boards themselves and to personnel and equipment used in carrying out the stripping.

It has been proposed in Russian Patent Specification No. 293312 to use an electrodeposited polymeric enamel to protect exposed copper during the manufacture of a printed circuit board. This enamel is cured for 20–30 minutes at temperatures above 150° C. which are undesirably high temperatures for a printed circuit board. Furthermore, after etching, the cured enamel has to be removed by treating the board in an alkaline solution at 70° to 80° C.: again these are severe conditions for a printed circuit board which can damage the base laminate.

In U.S. Pat. Nos. 4 746 399 and 4 751 172 there are described processes in which the exposed copper is protected by an electrodeposited resin which is left uncured while the resist is removed and etching is effected. While the uncured electro-deposited resins described in these patents can be removed under relatively mild conditions after etching, there is a need for them to have increased resistance to the solvent used to remove the resist and to the etchant used in the etching step. Furthermore, under commercial conditions, these uncured films are susceptible to mechanical damage from equipment such as brushes used in carrying out the resist removal and etching.

It has now been found that by immersing substrates bearing electrodeposited films such as those described in the above mentioned US patents in an aqueous solution or dispersion of a material which cures, either alone or by reaction with functional groups in the electrodeposited resin film, on heating or irradiation, such that the aqueous solution or dispersion diffuses into the surface of the electrodeposited film, and then subjecting the substrate to curing conditions for the curable material, the resulting treated electrodeposited film has good resistance to resist-removing solvents and etchants and good resistance to mechanical damage, but can nevertheless be removed, after the etching process, using mild conditions. The film can be removed completely before subsequent processing of the printed circuit board or left in place while a solder mask resist is formed in a predetermined pattern on the board, the film then being removed selectively from areas not covered by the solder mask resist.

Accordingly, the present invention provides a method of making a metallic pattern on a substrate having a surface comprising bare metal in predetermined areas and metal coated by a resist in remaining areas which comprises (i) protecting the bare metal by electrodepositing thereon a film of an organic resin, (ii) immersing the substrate bearing the electrodeposited resin film in an aqueous solution or dispersion of a hardening agent for said film, said hardening agent being a material which is curable, either alone or through reaction with functional groups in the electrodeposited resin film, on heating or irradiation, whereby said aqueous solution or dispersion diffuses into the surface of the electrodeposited resin film, (iii) subjecting the substrate to curing conditions for the hardening agent, thereby hardening the surface of the electrodeposited resin film and rendering it resistant to a solvent used to remove the resist and resistant to an etchant used to remove metal from areas exposed by removal of the resist, (iv) removing the resist from said remaining areas using a solvent which does not remove the electrodeposited resin film, and (v) etching metal exposed in step (iv) using an etchant which does not remove the electrodeposited resin film.

The resist present as a coating on the initial substrate may be an epoxide resin applied by a screen printing process and then cured. Preferably, the resist is a photoresist coated in selected areas by applying it uniformly to the substrate, which is usually a copper-clad laminate, subjecting it to actinic radiation in a predetermined pattern and then removing exposed or unexposed areas according to whether the photoresist is positive or negative respectively. Positive and negative photoresists for use in making printed circuit boards are well known materials and any of them may be used. They can be strippable under aqueous conditions or by means of an organic solvent. Another layer of copper or a layer of another metal such as nickel may be deposited on bare copper areas before electrodeposition in stage (i).

The resin film electrodeposited in stage (i) comprises an electrodepositable resin, which may be anodically depositable or cathodically depositable. Anodically depositable resins are preferred if acidic etchants are to be used, and cathodic types are preferred if alkaline etchants are to be used.

A particularly preferred combination is the use of a photoresist which is strippable under aqueous conditions in step (iv) and an electrodepositable resin which is strippable by means of an organic solvent after the etching step (v).

Any of the large number of electrodepositable resins may be used, including acrylic resins: adducts of epoxide resins with amines, polycarboxylic acids or their anhydrides, or aminocarboxylic, mercaptocarboxylic or aminosulphonic acids; polyurethanes; polyesters; and reaction products of phenolic hydroxyl group-containing resins with an aldehyde and an amine or amino- or mercapto- carboxylic or aminosulphonic acid. Suitable acrylic resins include copolymers of at least one acrylic ester such as an alkyl or hydroxyalkyl acrylate or methacrylate with an ethylenically unsaturated monomer containing a salt-forming group, such as an acrylic monomer containing a carboxyl or an amino group and, optionally, another ethylenically unsaturated monomer. Suitable epoxide resin adducts include those of diglycidyl ethers of dihydric alcohols or bisphenols with a primary or secondary amine, which may be a diamine such as ethylenediamine but is more usually a monoamine such as ethanolamine, 1-amino-2-propanol, diethanolamine or diethylamine, a polycarboxylic acid such as glutaric or adipic acid, a polycarboxylic acid anhydride such as maleic or succinic anhydride, an aminocarboxylic acid such as o-, m- or p-aminobenzoic acid or a mercaptocarboxylic acid. Suitable polyurethanes include adducts of hydroxyl-terminated polyurethanes with polycarboxylic acid anhydrides. Suitable polyesters include carboxyl-terminated polyesters derived from polyhydric alcohols such as ethylene glycol, 1,2-propylene glycol, 1,3-propylene glycol or butane-1,4-diol with polycarboxylic acids such as glutaric, adipic, maleic, tetrahydrophthalic and phthalic acids or esterifying derivatives thereof. Suitable reaction products of phenolic hydroxyl-containing resins include reaction products of phenol-terminated adducts of diglycidyl ethers with bisphenols, with aldehydes such as formaldehyde or benzaldehyde and amines such as ethanolamine, diethanolamine or ethylene diamine, aminocarboxylic acids such as glycine, sarcosine or aspartic acid, or mercaptocarboxylic acids such as thioglycolic or mercaptopropionic acid.

The electrodeposited resin film is preferably of an acrylic polymer or of an adduct of an epoxide resin with an amine.

Preferred acrylic polymers include copolymers of at least one monoacrylic monomer containing a carboxyl group and at least one monoacrylic ester, optionally together with at least one other vinyl monomer. Suitable carboxyl-containing monoacrylic monomers from which the copolymers may be derived include acrylic acid, methacrylic acid and adducts of a hydroxyalkyl acrylate or methacrylate with a polycarboxylic acid anhydride. Acrylic and methacrylic acids are particularly preferred carboxyl-containing acrylic monomers.

Suitable monoacrylic esters from which the copolymers may be derived include methyl acrylate, ethyl acrylate, n-butyl acrylate, n-hexyl acrylate, 2-ethylhexyl acrylate and the corresponding methacrylates. Preferably at least one monoacrylic ester contains a reactive functional group such as an epoxide group, a primary or secondary amino group, a blocked isocyanate group, or, preferably, a hydroxyl group. Suitable monoacrylic esters having such reactive groups include 2-aminoethyl acrylate, 2-hydroxyethyl acrylate, 2-hydroxypropyl acrylate, 3-hydroxypropyl acrylate and the corresponding methacrylates, reaction products of 2-isocyanatoethyl acrylate or 2-isocyanatoethyl methacrylate with an isocyanate-blocking agent, for example as described in U.S. Pat. No. 3 542 739, or reaction products of a polyisocyanate, preferably a tolylene diisocyanate, with a hydroxyalkyl acrylate or methacrylate such as those hereinbefore described and an isocyanate-blocking agent, for example as described in U.S. Pat. No. 4 113 958. Isocyanate-blocking agents are well known and include alcohols, phenols, mercaptans, primary and secondary amines, oximes, triazoles, pyrazoles and lactams. Preferred such blocking agents are oximes and lactam. A particularly preferred reactive group-containing monoacrylic ester is 2-hydroxyethyl methacrylate.

The optional vinyl monomer which may be copolymerised with the carboxyl-containing acrylic monomer and the monoacrylic ester may be, for example, a vinyl ester such as vinyl acetate, a vinyl halide such as vinyl chloride or, preferably, a styrene, such as styrene itself, alpha-methylstyrene or p-chlorostyrene, styrene itself being particularly preferred.

Other preferred acrylic polymers include copolymers of at least one monoacrylic monomer containing a tertiary amine group and at least one monoacrylic ester having a reactive functional group, optionally together with at least one other vinyl monomer. Suitable monoacrylic monomers containing a tertiary amine group from which the copolymers may be derived include dialkylaminoalkyl acrylates and dialkylaminoalkyl methacrylates, preferably 2-(dimethylamino)ethyl acrylate, 2-(diethylamino)ethyl acrylate, 2-(dimethylamino)propyl acrylate and the corresponding methacrylates, 2-(dimethylamino)ethyl methacrylate being especially preferred.

Reactive group-containing monoacrylic esters copolymerised with the tertiary amine-containing monoacrylic monomer may be acrylates or methacrylates containing an epoxide group, a blocked isocyanate group or, preferably a hydroxyl group, as hereinbefore described for the reactive group-containing monoacrylic esters copolymerised with the carboxyl-containing monoacrylic monomer.

The optional vinyl monomer which may be copolymerised with the tertiary amine group-containing monoacrylic monomer and the reactive group-containing monoacrylic ester may be, for example, an alkyl acrylate or methacrylate, such as methyl acrylate, ethyl acrylate, n-butyl acrylate, 2-ethylhexyl acrylate and the corresponding methacrylates, a vinyl ester such as vinyl acetate, a vinyl halide such as vinyl chloride or a styrene such as styrene, alpha-methyl styrene or p-chlorostyrene. Amongst these, the alkyl acrylates and methacrylates and styrene are preferred.

Particularly preferred acrylic polymers for use in the method of the invention are copolymers of (a) acrylic acid, methacrylic acid or 2-(dimethylamino)ethyl methacrylate with (b) a hydroxyalkyl acrylate or methacrylate and, optionally, (c) at least one further vinyl monomer, preferably selected from alkyl acrylates, alkyl methacrylates, styrene and mixtures of two or more thereof. The acrylates and methacrylates (b) and the alkyl acrylates and methacrylates for (c) are as hereinbefore described, with 2-hydroxyethyl methacrylate being particularly preferred as (b) and a mixture of styrene and 2-ethylhexyl acrylate being particularly preferred as (c).

The acrylic polymers may be prepared by conventional polymerisation processes using free radical polymerisation initiators such as peroxides or azo compounds, usually to give polymers having a number average molecular weight of 5000 or more, preferably 5000 to 50,000. Thus the monomers may be heated with the initiator in solution in an organic solvent, preferably a solvent which is miscible with the medium from which the polymer is to be electrodeposited. Conventional chain transfer agents such as tert.dodecyl mercaptan can be used when desired.

Preferred adducts of an epoxide resin with an amine are adducts of a polyglycidyl ether, which may be of a polyhydric phenol or a polyhydric alcohol, with a secondary monoamine. Suitable polyglycidyl ethers include those of dihydric alcohols such as butane-1,4-diol, neopentyl glycol, hexamethylene glycol, oxyalkylene glycols and polyoxyalkylene glycols, and trihydric alcohols such as glycerol, 1,1,1-trimethylolpropane and adducts of these alcohols with ethylene oxide or propylene oxide. It will be understood by those skilled in the art that these polyglycidyl ethers of polyhydric alcohols are usually advanced, i.e. converted into longer chain higher molecular weight polyglycidyl ethers, for example by reaction with a dihydric alcohol or phenol, so that the resulting polyglycidyl ethers give adducts with suitable electrodepositable film-forming properties on reaction with the secondary monoamine. Preferred polyglycidyl ethers are those of polyhydric phenols, including bisphenols such as bisphenol F, bisphenol A and tetrabromobisphenol A and phenolic novolak resins such as phenol-formaldehyde or cresol-formaldehyde novolak resins. These polyglycidyl ethers of phenols may have been advanced, for example by reaction with dihydric alcohols or phenols such as those hereinbefore described. Particularly preferred polyglycidyl ethers are polyglycidyl ethers of bisphenol A advanced by reaction with bisphenol A.

Secondary monoamines suitable for adduct formation with the polyglycidyl ethers include dialkylamines such as diethylamine, di-n-propylamine, di-isopropylamine, di-n-butylamine, di-n-octylamine and di-n-dodecylamine or nitrogen heterocycles such as piperidine or morpholine. Preferred secondary monoamines are secondary alkanolamines such as diethanolamine, N-methylethanolamine, N-butylethanolamine, diisopropanolamine, N-methylisopropanolamine or di-n-butanolamine. A particularly preferred secondary alkanolamine is diethanolamine.

Thus preferred adducts of polyglycidyl ether with a secondary monoamine are adducts of a polyglycidyl ether of a polyhydric phenol, which may have been advanced, with a secondary alkanolamine, while particularly preferred such adducts are those of a polyglycidyl ether of bisphenol A, advanced by reaction with bisphenol A, with diethanolamine.

Electrodeposition of the organic resin may be carried out using conventional procedures. Thus the electrodepositable resin, optionally together with conventional additives such as pigments, dyes, fillers and plasticizers, can be dissolved or dispersed in an aqueous medium, which may contain a minor amount of an organic solvent, together with an acid or base to at least partially neutralise salt-forming groups on the resin. The aqueous electrodeposition medium generally contains from 2 to 60%, preferably from 5 to 25%, by weight of the resin. The metallic surface on which the resin film is to be electrodeposited can be immersed in the electrodeposition medium as an anode or cathode, depending on whether the resin is anodically or cathodically depositable, another electrode of opposite charge immersed in the medium and a current passed between the electrodes to electrodeposit the resin on the required electrode.

Electrodeposition for only a few minutes, usually one minute, at a voltage of up to 200 volts is sufficient in most cases. Voltages as low as 2 volts may be used in some cases, especially if the size of the electrode on which the resin film is deposited is small in relation to the other electrode. For example, a cathodically depositable resin may be deposited on a small cathode in a tank where the whole of the tank is the anode, at voltages of 2 volts or 5 volts. Adhesion of the resin film may be improved if it is deposited in two steps, first at a low voltage and then at a higher voltage. For example, a good coating can be obtained by electrodepositing the resin at 2 volts for 2 minutes, followed by deposition at 5 volts for up to 5 minutes.

After electrodeposition of the organic resin film, the substrate is immersed in an aqueous solution or dispersion of the hardening agent. Suitable hardening agents include photocurable materials, preferably a photocurable material having, on average, more than one polymerisable acrylic group per molecule, together with a photoinitiator therefor. Suitable such acrylic materials include esters of acrylic or methacrylic acid, or a carboxylcontaining adduct of a hydroxyalkyl acrylate or methacrylate and a polycarboxylic acid anhydride, with a polyhydric alchol, which can be a low molecular weight alcohol or a film-forming resin, or with an epoxide resin; and acrylic urethane reaction products of isocyanate-terminated polyurethane prepolymers with a hydroxyalkyl acrylate or hydroxyalkyl methacrylate. Preferred such photocurable acrylic materials are monomers containing at least two acrylate or methacrylate groups, particularly esters of acrylic acid or methacrylic acid with polyhydric alcohols having 2 to 6 hydroxyl groups, including aliphatic polyhydric alcohols having up to 12 carbon atoms, for example diols, such as ethylene, 1,2-propylene, trimethylene, tetramethylene, neopentyl, hexamethylene, octamethylene and dodecamethylene glycols, and oxyalkylene glycols such as di-, tri-, and tetra-ethylene glycols and tri(propylene glycol), triols such as glycerol and 1,1,1-trimethylolpropane, and tetrols such as ethythritol and pentaerythritol; cycloaliphatic polyhydric alcohols such as di- or tri-hydroxymethyl-substituted cyclohexanes; heterocyclic polyhydric alcohols such as tris(2-hydroxyethyl) isocyanurate; and aromatic polyhydric alcohols such as dimethylol- and trimethylolbenzenes and 2,2-bis(p-(2-hydroxyethoxy)phenyl)propane. Many of these acrylates and methacrylates are commercially available. Those that are not can be made by conventional processes, for example by esterifying the polyhydric alcohol with acrylic or methacrylic acid or an esterifying derivative thereof such as acryloyl chloride or methacryloyl chloride.

Photoinitiators for use with curable acrylic materials are well known and many different types are commercially available. Any of the known types can be used in a conventional amount, generally from 0.1 to 20%, preferably 1 to 10%, by weight of the polymerisable material. Thus the photoinitiator may be an aromatic carbonyl compound, for example a benzoin alkyl ether such as the isopropyl or n-butyl ether, an alpha-substituted acetophenone, for example a benzil dialkyl ketal such as benzil dimethyl ketal, an alpha-halo-acetophenone such as trichloromethyl p-tert.butylphenyl ketone, an alpha-aminoacetophenone such as dimethylaminomethyl phenyl ketone and morpholinomethyl phenyl ketone, a dialkoxyacetophenone such as diethoxyacetophenone, or an alpha-hydroxyacetophenone such as 1-hydroxycyclohexylphenyl ketone or a benzophenone such as benzophenone itself and bis(4-dimethylamino)benzophenone; a metallocene, for example a titanium metallocene such as bis(pi-methylcyclopentadienyl)bis(sigma-pentafluorophenyl) titanium (IV), a Group IVA organometallic compound, for example a stannane such as trimethyl benzyl stannane or dibutyldibenzyl stannane, together with a photoreducible dye, typically methylene blue or rose bengal; a quinone, such as anthraquinone or camphorquinone, together with an amine having hydrogen attached to an aliphatic alpha carbon atom, preferably a tertiary amine such as bis(4-dimethylamino)benzophenone and triethanolamine; a thioxanthone, for example an alkyl- or halogen-substituted thioxanthone such as 2-isopropylthioxanthone or 2-chloroehioxanthone; an acyl phosphine oxide; or a mixture of two or more thereof.

Other suitable hardening agents are heat-curable aminoplast resins, including urea-formaldehyde resins and aminotriazine-formaldehyde resins such as melamine-formaldehyde and benzoguanamine-formaldehyde resins, including etherified and unetherified resins. Preferred aminoplasts are melamine-formaldehyde and benzoguanamine-formaldehyde resins, especially methylated and butylated resins of these types. Preferably, in order to achieve suitably rapid cure at temperatures up to 150° C., the aminoplast resins are used together with a curing catalyst which releases an acid on heating; such curing catalysts are well known and include ammonium and amine salts of strong inorganic and organic acids, e.g. ammonium chloride, ammonium sulphate, and salts of p-toluenesulphonic acid with amines such as triethylamine, triethanolamine and morpholine, the morpholine salt of p-toluenesulphonic acid being particularly preferred.

When the electrodeposited resin film contains carboxyl, hydroxyl or primary or secondary groups, the hardening agent may be a material having blocked isocyanate groups, i.e. isocyanate groups blocked by reaction with an active hydrogen atom so that the resulting blocked group is unreactive at ambient temperatures but is reactive at elevated temperatures. Blocked isocyanate materials suitable for use in the method of the invention may be any of the known materials, including those prepared by reacting a polyisocyanate, i.e. a material having, per average molecule, more than one isocyanate group, with a blocking agent having an alcoholic or phenolic hydroxyl group, a mercaptan group, a primary or secondary amino group, an imidazole group, an oxime group, a triazole group, a pyrazole group or a lactam group. The blocking reactions may be carried out at 30°-110° C. in an inert solvent.

The material having more than one isocyanate group per molecule may be an isocyanate-terminated prepolymer; preferably it is an aliphatic, cycloaliphatic or aromatic diisocyanate such as 1,2-propylene, 1,3-propylene, 1,2-butylene, 1,4-butylene and hexamethylene diisocyanates, isophorone diisocyanate (3-isocyanatomethyl-3,5,5-trimethylcyclohexylisocyanate), m- and p-phenylene diisocyanates, 2,4- and 2,6-tolylene diisocyanates, 1-chloro-2,4-diisocyanatobenzene, 1,4-naphthalene diisocyanate, 4,4'-diphenylmethane diisocyanate and 4,4'-diphenylether diisocyanate. Amongst these, the aromatic diisocyanates are preferred, especially tolylene-2,4-diisocyanate and 4,4'-diphenylmethane diisocyanate.

The blocking agent may be any of the types hereinbefore specified which gives a blocked isocyanate which can be deblocked at temperatures up to 150° C. and has the desired solubility in the solvent to be used for step (ii) of the process. Preferred blocking agents include oximes such as acetaldoxime, benzaldoxime, p-nitrobenzaldoxime, acetoxime, 2-butanone oxime (methylethyl ketoxime), methylisopropyl ketoxime, ethylhexylketoxime, acetophenone oxime, benzophenone oxime, cyclopentanone oxime and cyclohexanone oxime, and a mixture of such an oxime with an alcohol, preferably a polyhydric alcohol such as ethylene glycol, propylene glycols, butylene glycols, glycerol and 1,1,1-trimethylolpropane. When a mixture of an oxime and a polyhydric alcohol is used, the polyisocyanate is usually reacted first with the oxime and then with the polyhydric alcohol. Particularly preferred blocked isocyanates used in the method of the invention are tolylene-2,4-diisocyanate blocked by reaction first with methylethyl ketoxime, then with either butane-1,4-diol or 1,1,1-trimethylolpropane, and 4,4'-diphenylmethane diisocyanate blocked by reaction with methylethyl ketoxime.

The aqueous solvent in which the hardening agent is dissolved or dispersed is usually a mixture of water with a water-miscible organic solvent such as ethanol, 2-ethoxyethanol, 2-n-butoxyethanol, or diethyleneglycol monobutyl ether (butyl digol) to assist diffusion of the hardening agent into the surface of the electrodeposited organic resin film. The most desirable ratio of water:organic solvent for a particular hardening agent can be found by routine experimentation.

After immersion in the hardening agent, the substrate is subjected to curing conditions for the hardening agent. Thus, when the hardening agent is photocurable, the substrate, usually after drying at temperatures up to 120° C., is irradiated with actinic radiation in step (iii) so that the surface of the electrodeposited resin film, which now contains the diffused hardening agent, is hardened. When the hardening agent is curable on heating, either alone or through reaction with functional groups in the electrodeposited resin film, the substrate is heated in stage (iii), usually at temperatures up to 150° C., to harden the surface of the electrodeposited resin film.

The immersion time in step (ii) and the time for which the substrate is subjected to curing conditions for the hardening agent in step (iii) are usually controlled so that the surface of the electrodeposited resin film is hardened sufficiently to render it resistant to the solvent used to remove the resist in step (iv) and to the etchant used in step (v) but the film can still be removed by another solvent in subsequent processing. Suitable immersion and curing times can readily be determined by routine experimentation.

An aqueous solvent may be used to remove the resist in step (iv). After the etching step (v), at least part of the electrodeposited film may be removed using a solvent therefor. It is possible to use a combination of a resist and an electrodeposited resin film which are both strippable under acidic aqueous conditions or both strippable under basic aqueous conditions provided that the resist is strippable under milder conditions than are needed to remove the electrodeposited film, e.g. a more dilute solution of acid or base. It is also possible to use a resist and an electrodeposited film which are removable by different organic solvents.

When an organic solvent is used to remove the resist in step (iv), a suitable solvent which does not dissolve the electrodeposited film can be found by routine experimentation. Both this solvent and the solvent used subsequently to remove the electrodeposited film can be selected from halohydrocarbons such as 1,1,1-trichloroethane and dichloromethane, hydroxylic solvents such as ethanol, 2-n-butoxyethanol and diethyleneglycol monobutyl ether (butyl digol), esters such as 2-ethoxyethyl acetate and propylene carbonate, ketones such as acetone, methyl ethyl ketone and cyclohexanone, ethers such as tetrahydrofuran, lactones such as butyrolactone and mixtures of two or more thereof.

Preferably, the resist is removed in step (iv) using an aqueous solvent and at least part of the electrodeposited film is removed using an organic solvent, the resist and film being chosen accordingly.

In step (v) of the process of the invention, the metal exposed by removal of the resist, usually copper, may be removed by any well known etchant such as ferric chloride, hydrogen peroxide/phosphoric acid, ammonium persulphate or cupric chloride.

At the end of step (v), the substrate has a surface comprising predetermined areas of metal covered by the electrodeposited film and predetermined areas from which the metal has been removed by the etching process. Where the initial substrate is a copper-clad plastics laminate, at the end of step (v) the surface comprises predetermined areas of copper covered by the electrodeposited resin film and areas in which the laminate base is devoid of copper.

After the etching, at least part of the electrodeposited resin film may be removed using a solvent therefor to leave bare copper areas for electrical connections. In one embodiment, a further resist to act, for example, as a solder mask is formed in a predetermined pattern over the electrodeposited film, thereby leaving areas of the electrodeposited film uncovered by the further resist and said uncovered areas of the electrodeposited film are then removed. The pattern formation of the further resist can be effected by applying a photocurable resin composition directly in a predetermined pattern using a screen printing technique and irradiating the screen printed layer to effect cure thereof. Photocurable resin compositions which can be applied by screen printing are well known to those skilled in the art of making printed circuit boards. The photocurable resins can be, for example, resins containing polymerisable acrylate or methacrylate ester groups used together with free radicalgenerating photoinitiators therefor.

Preferably, the further resist is a photoresist which is applied in a layer over the electrodeposited film, irradiated in a predetermined pattern, thereby effecting a difference in solubility between exposed parts thereof, and treated with a solvent to remove more soluble parts, this treatment with solvent or a subsequent solvent treatment removing electrodeposited film underlying the more soluble parts of the irradiated photoresist.

Conventional positive and negative photoresists may be used as the further resist. They may be irradiated with actinic radiation in a predetermined pattern and developed using known procedures.

In embodiments of the invention when a further resist is applied, preferably the first resist is removed by aqueous solvents, the more soluble parts of the irradiated further resist are removed by means of an organic solvent, and the electrodeposited film underlying those parts is removed by means of an organic solvent used to remove the further resist.

The process of the invention is particularly useful in the production of printed circuits, including multilayer circuits having plated through holes or vias.

The invention is illustrated by the following Examples, in which parts and percentages are by weight unless otherwise indicated.

Resins used in the Examples are prepared as follows:
Resin I

A monomer mixture consisting of styrene (47.5 parts), 2-ethylhexyl acrylate (25 parts), 2-hydroxyethyl methacrylate (20 parts) and 2-(dimethylamino)ethyl methacrylate (7.5 parts) with azobis(isobutyronitrile) (1.5 parts) is added dropwise over 2 hours to 2-n-butoxyethanol (50 parts) stirred under nitrogen at 100° C. The reaction mixture is maintained at 100° C. for a further 1 hour and a further charge of azobis(isobutyronitrile) (0.5 part) and 2-n-butoxyethanol (5.5 parts) is added. This procedure, namely heating at 100° C. for 1 hour then adding a further charge, is repeated twice more and the reaction mixture is held at 100° C. for a further hour and then cooled to ambient temperature. The amine value of the resulting copolymer solution is 0.28 eq/kg and the number average molecular weight of the copolymer is 10,416.

Resin II

An epoxide resin prepared by advancing a diglycidyl ether of bisphenol A by reaction with bisphenol A (epoxide content 1.1 equivs/kg, 50 parts) is dissolved in 2-n-butoxyethanol (50 parts) at 120° C. Diethanolamine (5.88 parts) is added dropwise over 15 minutes and the mixture is stirred at 120° C. for a further 3 hours, by which time the epoxide content is negligible. The reaction product is cooled to ambient temperature.

Resin III

A monomer mixture consisting of styrene (55 parts), 2-ethylhexyl acrylate (21 parts), 2-hydroxyethyl methacrylate (20 parts) and methacrylic acid (4 parts) with azobis(isobutyronitrile) (1.5 parts) is added dropwise over 2 hours to 2-n-butoxyethanol (50 parts) stirred at 100° C. The reaction mixture is maintained at 100° C. for a further hour and a further charge of azobis(isobutyronitrile) (0.5 part) and 2-n-butoxyethanol (10 parts) is added. This procedure, namely heating at 100° C. for 1 hour then adding a further charge, is repeated twice more and the reaction mixture is held at 100° C. for a further hour. 2-n-butoxyethanol (20 parts) is added and the mixture is cooled to ambient temperature. It is then evaporated at 100° C. under vacuum on a rotary evaporator to remove unreacted monomers. The acid value of the resulting copolymer solution is 0.21 eq/kg and the number average molecular weight of the copolymer is 11,260.

Resin IV

A monomer mixture consisting of styrene (60 parts), 2-ethylhexyl acrylate (27.5 parts), 2-hydroxyethyl methacrylate (7.5 parts) and 2-(dimethylamino)ethyl methacrylate (5 parts) with azobis(isobutyronitrile) (1.5 parts) is added dropwise over 2 hours to 2-n-butoxyethanol (50 parts) stirred at 120° C. The reaction mixture is maintained at 120° C. for a further hour and a further charge of azobis(isobutyronitrile) (0.5 part) and 2-n-butoxyethanol (5.5 parts) added. This procedure - heating at 120° C. for 1 hour then adding a further charge - is repeated twice more and the reaction mixture is held at 120° C. for a further hour and then cooled to ambient temperature. The amine value of the resulting solution is 0.19 eq/kg and the molecular weight of the copolymer is 10,279.

Resin V

An epoxide resin prepared by advancing a diglycidyl ether of bisphenol A by reaction with bisphenol A (epoxide content 1.5 equivs/kg, 50 parts) is dissolved in 2-n-butoxyethanol (50 parts) at 120° C. Diethanolamine (7.67 parts) is added dropwise over 15 minutes and the mixture is stirred at 120° C. for a further 3 hours, by which time the epoxide content is negligible. The reaction product is cooled to ambient temperature.

The RISTON photoresist used in the Examples is an aqueous developable photocurable acrylate group-containing dry film resist incorporating a free radical photoinitiator available from Du Pont (UK) Limited., Riston Division, Wedgewood Way, Stevenage, Hertfordshire SG1 4QN, England.

The HOECHST HB 1160 DRY FILM STRIPPER used in the Examples is an aqueous mixture of ethanolamine and butoxyethanol and is available from Hoechst U.K. Ltd., Electronic Products Division, Unit 20, Smiths Industrial Estate, Humber Avenue, Coventry, CV3 1JR, England.

Technical grade tolylene-2,4-diisocyanate used in the Examples is a mixture of 80% tolylene-2,4-diisocyanate and 20% tolylene-2,6-diisocyanate.

EXAMPLE 1

A copper-clad laminate coated with RISTON 3415 aqueous developable photoresist, which has been imaged and developed to form a pattern in the photoresist, is used as the cathode in an electrodeposition bath equipped with a stainless steel anode and containing a solution of Resin I (100 parts) and aqueous 20% lactic acid (6.7 parts) in water (493.3 parts). A voltage of 30 volts is applied for one minute and the laminate is then removed from the bath and rinsed with water. The electrodeposited resin film coats the areas where there is no photoresist and the copper is exposed. The laminate is then immersed for 30 seconds in a bath containing pentaerythritol triacrylate (100 parts), benzil dimethyl ketal (5 parts), water (150 parts) and 2-n-butoxyethanol (245 parts), rinsed in water and dried at 110° C. for 5 minutes. The dried laminate is irradiated using a 5kw metal halide lamp at a distance of 75 cm for 4 minutes to harden the surface of the electrodeposited resin film. The laminate is then immersed in an aqueous 20% solution of HOECHST HB 1160 DRY FILM STRIPPER at 50° C. This treatment removes the photoresist leaving the electrodeposited film. The copper exposed by removing the photoresist is etched away in a solution of concentrated sulphuric acid (20 parts) and ammonium persulphate (150 parts) in water (830 parts) at 50° C., after which the laminate is washed in water and dried, to leave a clear pattern, in copper covered with electro-deposited film, on the laminate base. Immersion in a mixture of propylene carbonate (50 parts), gamma-butyrolactone (20 parts) and butyl digol (30 parts) removes the electrodeposited film to leave a clear copper pattern on the laminate base.

EXAMPLE 2

A copper-clad laminate coated with RISTON 3415 aqueous developable photoresist, which has been imaged and developed to form a pattern in the photoresist, is used as the cathode in an electrodeposition bath equipped with a stainless steel anode and containing a solution of Resin II (100 parts) and aqueous 20% lactic acid (18.5 parts) in water (409.2 parts). A voltage of 20 volts is applied for one minute, following which the laminate is removed from the bath and rinsed with water. The electrodeposited resin film coats the areas where there is no photoresist and the copper is exposed. The laminate is then immersed for 2 minutes in a bath containing a methylated melamine-formaldehyde resin (substantially hexamethoxymethylmelamine) (100 parts), the morpholine salt of p-toluenesulphonic acid (7.5 parts), 2-n-butoxyethanol (100 parts) and water (292.5 parts), followed by rinsing in water. The laminate is then heated at 150° C. for 5 minutes to harden the surface of the electrodeposited resin film. The RISTON photoresist is removed by immersing the laminate in an aqueous 20% solution of HOECHST HB 1160 DRY FILM STRIPPER at 50° C. The copper exposed by removing the photoresist is etched away in a solution of concentrated sulphuric acid (20 parts), and ammonium persulphate (150 parts) in water (830 parts) at 50° C., after which the laminate is washed with water and dried, to leave a clear pattern, in copper covered with the electrodeposited film, on the laminate base. Immersion in a mixture of propylene carbonate (50 parts), gamma-butyrolactone (20 parts) and butyl digol (30 parts) removes the electrodeposited film to leave a clear copper pattern on the laminate base.

EXAMPLE 3

A copper-clad laminate coated with RISTON 3415 aqueous developable photoresist, which has been imaged and developed to form a pattern in the photoresist, is used as the anode in an electrodeposition bath equipped with a stainless steel cathode and containing a solution of Resin III (100 parts) and aqueous 20% potassium hydroxide solution (5 parts) in water (395 parts). A voltage of 60 volts is applied for one minute and the laminate is removed from the bath and rinsed with water. The electrodeposited resin film coats the areas where there is no photoresist and the copper is exposed. The laminate is then immersed for 2 minutes in a bath containing a methylated melamine-formaldehyde resin (substantially hexamethoxymethyl melamine) (100 parts), morpholine salt of p-toluenesulphonic acid (7.5 parts), 2-n-butoxyethanol (100 parts) and water (292.5 parts), followed by rinsing in water. The laminate is then heated at 150° C. for 5 minutes to harden the surface of the electrodeposited resin film. The RISTON photoresist is removed by immersing the laminate in an aqueous 20% solution of HOECHST HB 116o DRY FILM STRIPPER at 50° C. The copper exposed by removing the photoresist is etched away in a solution of concentrated sulphuric acid (20 parts) and ammonium persulphate (150 parts) in water (830 parts) at 50° C., after which the laminate is washed with water and dried, to leave a clear pattern, in copper covered with the electrodeposited film, on the laminate base. Immersion in a mixture of propylene carbonate (50 parts), gamma-butyrolactone (20 parts) and butyl digol (30 parts) removes the electrodeposited film to leave a clear copper pattern on the laminate base.

EXAMPLE 4

A copper-clad laminate coated with RISTON 3415 aqueous developable photoresist, which has been imaged and developed to form a pattern in the photoresist, is used as the anode in an electrodeposition bath equipped with a stainless steel cathode and containing a solution of Resin III (100 parts) and aqueous 20% potassium hydroxide solution (5 parts) in water (395 parts). After applying a voltage of 60 volts for one minute, the laminate is removed from the bath and rinsed with water. The electrodeposited film coats the areas where there is no photoresist and the copper is exposed. The laminate is then immersed for 1 minute in a bath containing a blocked isocyanate prepared from 4,4'-diphenylmethane diisocyanate and methylethyl ketoxime (40 parts), 2-n-butoxyethanol (100 parts) and water (60 parts), followed by rinsing in water. The laminate is then heated at 110° C. for 15 minutes to harden the surface of the electrodeposited resin film. The RISTON photoresist is removed by immersing the laminate in an aqueous 20% solution of HOECHST HB 1160 DRY FILM STRIPPER at 50° C. The copper exposed by removing the photoresist is etched away in a solution of concentrated sulphuric acid (20 parts) and ammonium persulphate (150 parts) in water (830 parts) at 50° C., after which the laminate is washed with water and dried, to leave a clear pattern, in copper covered with the electrodeposited film, on the laminate base. Immersion in a mixture of propylene carbonate (50 parts), gamma-butyrolactone (20 parts) and butyl digol (30 parts) removes the electrodeposited film to leave a clear copper pattern on the laminate base.

EXAMPLE 5

The procedure of Example 2 is repeated, but using an electrodeposition bath containing a solution of Resin I (100 parts) and aqueous 20% lactic acid (6.7 parts) in water (493.3 parts) instead of the electrodeposition bath used in Example 2 and applying a voltage of 30 volts for one minute instead of 20 volts for one minute. A clear copper pattern on the laminate base is obtained.

EXAMPLE 6

A copper-clad laminate coated with RISTON 3415 aqueous developable photoresist, which has been imaged and developed to form a pattern in the photoresist, is used as the anode in an electrodeposition bath equipped with a stainless steel cathode and containing a solution of Resin III (100 parts) and aqueous 20% potassium hydroxide solution (5 parts) in water (395 parts). After applying a voltage of 60 volts for one minute, the laminate is removed from the bath and rinsed with water. The electrodeposited resin film coats the areas where there is no photoresist and the copper is exposed. The laminate is then immersed for 2 minutes in a bath containing a blocked isocyanate (8 parts, prepared by reacting 2 moles of technical grade tolylene-2,4-diisocyanate first with 2 moles of methylethyl ketoxime, then with 1 mole of 1,1,1-trimethylolpropane), 2-n-butoxyethanol (22 parts) and water (10 parts), followed by rinsing in water. The laminate is then heated at 110° C. for 15 minutes to harden the surface of the electrodeposited resin film. The RISTON photoresist is removed by immersing the laminate in an aqueous 20% solution of HOECHST HB 1160 DRY FILM STRIPPER at 50° C. The copper exposed by removing the photoresist is etched away in a solution of concentrated sulphuric acid (20 parts) and ammonium persulphate (150 parts) in water (830 parts) at 50° C., after which the laminate is washed with water and dried, to leave a clear pattern, in copper covered with the electrodeposited film, on the laminate base. Immersion in a mixture of propylene carbonate (50 parts), gamma-butyrolactone (20 parts) and butyl digol (30 parts) removes the electrodeposited film to leave a clear copper pattern on the laminate base.

EXAMPLE 7

The procedure of Example 3 is repeated, but omitting the morpholine salt from the bath in which the laminate is immersed after electrodeposition, increasing the amount of water in this bath to 300 parts, and heating the laminate at 150° for 10 minutes instead of 5 minutes. A clear copper pattern on the laminate base is obtained.

EXAMPLE 8

A copper-clad laminate coated with RISTON 3415 aqueous developable photoresist, which has been imaged and developed to form a pattern in the photoresist, is used as the cathode in an electrodeposition bath equipped with a stainless steel anode and containing a solution of Resin I (100 parts) and aqueous 20% lactic acid (6.7 parts) in water (493.3 parts). After applying a voltage of 80 volts for one minute, the laminate is removed from the bath and rinsed with water. The electrodeposited resin film coats the areas where there is no resist and the copper is exposed. The laminate is then immersed for 60 seconds in a bath containing a blocked isocyanate (4 parts, prepared by reacting 2 moles of technical grade tolylene-2,4-diisocyanate first with 2 moles of methylethyl ketoxime then with 1 mole of 1,4-butanediol), water (4 parts) and 2-n-butoxyethanol (12 parts), followed by rinsing in water. The laminate is then heated at 130° C. for 15 minutes to harden the surface of the electrodeposited resin film. The RISTON photoresist is removed by immersing the coated laminate in an aqueous 20% solution of HOECHST HB 1160 DRY FILM STRIPPER at 50° C. The copper exposed by removing the photoresist is etched away in a solution of concentrated sulphuric acid (20 parts) and ammonium persulphate (150 parts) in water (830 parts) at 50° C. after which the laminate is washed with water and dried, to leave a clear pattern, in copper covered with the electrodeposited film, on the laminate base. Immersion in a mixture of propylene carbonate (50 parts), gamma-butyrolactone (20 parts) and butyl digol (30 parts) removes the electrodeposited film to leave a clear pattern on the laminate base.

EXAMPLE 9

The procedure of Example 4 is repeated using an electro-deposition bath equipped with a stainless steel anode and containing a solution of Resin V (100 parts) and aqueous 20% lactic acid (15.5 parts) in water (411.5 parts) instead of the electrodeposition bath used in Example 4, applying a voltage of 20 volts for one minute instead of 60 volts for one minute and heating the laminate at 130° C. instead of 110° C. This procedure gives a clear copper pattern on the laminate base.

EXAMPLE 10

The procedure of Example 5 is repeated, replacing the bath in which the laminate is immersed after electrodeposition by a bath containing BEETLE BE 659, a butylated benzoguanamine-formaldehyde resin (70% solution in butanol) (100 parts), morpholine p-toluenesulphonate (10.5 parts), 2-n-butoxyethanol (170 parts) and water (70 parts) and heating the laminate at 130° C. instead of 150° C. This procedure gives a clear copper pattern on the laminate base.

We claim:
1. A method of making a metallic pattern on a substrate having a surface comprising bare metal in predetermined areas and metal coated by a resist in remaining areas which comprises
  (i) protecting the bare metal by electrodepositing thereon a film of an organic resin,
  (ii) immersing the substrate bearing the electrodeposited resin film in an aqueous solution or dispersion of a hardening agent for said film, said hardening agent being a material which is curable, either alone or through reaction with functional groups in the electrodeposited resin film, on heating or irradiation, whereby said aqueous solution or dispersion diffuses into the surface of the electrodeposited resin film, (iii) subjecting the substrate to curing conditions for the hardening agent, thereby hardening the surface of the electrodeposited resin film and rendering it resistant to a solvent used to remove the resist and resistant to an etchant used to remove metal from areas exposed by removal of the resist, (iv) removing the resist from said remaining areas using a solvent which does not remove the electrodeposited resin film, and (v) etching metal exposed in step (iv) using an etchant which does not remove the electrodeposited resin film.

2. A method according to claim 1, in which the electrodeposited resin film is of an acrylic polymer or an adduct of an epoxide resin with an amine.

3. A method according to claim 2, in which said polymer is a copolymer of at least one monoacrylic monomer containing a carboxyl group, at least one monoacrylic ester and, optionally, at least one other vinyl monomer.

4. A method according to claim 2, in which the acrylic polymer is a copolymer of at least one monoacrylic monomer containing a tertiary amine group, at least one monoacrylic ester having a reactive functional group and, optionally, at least one other vinyl monomer.

5. A method according to claim 2, in which said polymer is a copolymer of (a) acrylic acid, methacrylic acid or dimethylaminoethyl methacrylate with (b) a hydroxyalkyl acrylate or methacrylate and, optionally, (c) at least one further vinyl monomer.

6. A method according to claim 5, in which said further vinyl monomer is selected from alkyl acrylates, alkyl methacrylates, styrene or mixtures of two or more thereof.

7. A method according to claim 2, in which the electrodeposited resin film is of an adduct of a polyglycidyl ether with a secondary monoamine.

8. A method according to claim 7, in which the polyglycidyl ether is a polyglycidyl ether of a polyhydric phenol, which may have been advanced.

9. A method according to claim 7, in which the secondary monoamine is a secondary alkanolamine.

10. A method according to claim 1, in which the hardening agent is a photocurable material having, on average, more than one polymerisable acrylic group per molecule, together with a photoinitiator therefor, and the substrate is irradiated with actinic radiation in step (iii).

11. A method according to claim 10, in which the photocurable material is a monomer having at least two acrylate or methacrylate groups.

12. A method according to claim 1, in which the hardening agent is a heat-curable aminoplast resin and the substrate is heated in step (iii).

13. A method according to claim 12, in which the aminoplast resin is a melamine-formaldehyde or benzoguanamine-formaldehyde resin.

14. A method according to claim 12, in which the aminoplast is used together with a curing catalyst which releases an acid on heating.

15. A method according to claim 1, in which the electrodeposited resin film contains carboxyl, hydroxyl or primary or secondary amino groups, the hardening agent is a material having blocked isocyanate groups and the substrate is heated in step (iii).

16. A method according to claim 15, in which the hardening agent is a reaction product of an aromatic diisocyanate with either an oxime or a mixture of an oxime and an alcohol.

17. A method according to claim 1, in which the aqueous solvent in which the hardening agent is dissolved or dispersed is a mixture of water with a water-miscible organic solvent.

18. A method according to claim 1, in which the resist is removed in step (iv) using an aqueous solvent and, after the etching step (v), at least part of the electrodeposited resin film is removed using an organic solvent.

19. A method according to claim 1, in which the metallic pattern is a printed circuit.

* * * * *